US008884375B2

(12) United States Patent
Nakai et al.

(10) Patent No.: US 8,884,375 B2
(45) Date of Patent: Nov. 11, 2014

(54) SEMICONDUCTOR INTEGRATED CIRCUIT DEVICE

(75) Inventors: Satoshi Nakai, Kawasaki (JP); Masato Suga, Kawasaki (JP); Jusuke Ogura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1441 days.

(21) Appl. No.: 12/561,719

(22) Filed: Sep. 17, 2009

(65) Prior Publication Data
US 2010/0001350 A1 Jan. 7, 2010

Related U.S. Application Data

(63) Continuation of application No. PCT/JP2007/057152, filed on Mar. 30, 2007.

(51) Int. Cl.
| H01L 29/76 | (2006.01) |
| H01L 21/336 | (2006.01) |
| H01L 21/8238 | (2006.01) |
| H01L 21/02 | (2006.01) |
| H01L 29/78 | (2006.01) |
| H01L 29/66 | (2006.01) |

(52) U.S. Cl.
CPC ...... *H01L 21/02225* (2013.01); *H01L 21/8238* (2013.01); *H01L 21/823807* (2013.01); *H01L 29/665* (2013.01); *H01L 29/7843* (2013.01)
USPC ............ 257/374; 257/E21.546; 257/E21.663; 257/E21.642; 257/E21.317; 257/E21.444; 438/197

(58) Field of Classification Search
USPC ........... 257/369, E27.062, E29.255, E21.409, 257/288, 365; 438/197, 285, 300, 585
See application file for complete search history.

(56) References Cited

U.S. PATENT DOCUMENTS

| 7,611,938 B2 * | 11/2009 | Cheng et al. ................. 438/199 |
| 2002/0127791 A1 * | 9/2002 | Nanjo et al. ................. 438/231 |
| 2008/0124877 A1 * | 5/2008 | Pei ................. 438/300 |
| 2010/0193870 A1 * | 8/2010 | Ho et al. ................. 257/365 |
| 2010/0244185 A1 * | 9/2010 | Takafuji et al. ............... 257/507 |

FOREIGN PATENT DOCUMENTS

| JP | 02-206160 A | 8/1990 |
| JP | 2006-173432 A | 6/2006 |
| JP | 2007-005626 A | 1/2007 |

OTHER PUBLICATIONS

International Search Report PCT/JP2007/057152, mailing date of Jun. 26, 2007.
Japanese Office Action dated Aug. 21, 2012, issued in corresponding Japanese Patent Application No. 2009-508812, with Partial translation (5 pages).

* cited by examiner

*Primary Examiner* — Zandra Smith
*Assistant Examiner* — Tsz Chiu
(74) *Attorney, Agent, or Firm* — Westerman, Hattori, Daniels & Adrian, LLP

(57) ABSTRACT

A disclosed semiconductor integrated circuit device includes a semiconductor substrate; and multiple semiconductor elements disposed on the semiconductor substrate. The semiconductor elements include an n-channel MOS transistor and a p-channel MOS transistor. The n-channel MOS transistor is covered by a tensile stress film, and the p-channel MOS transistor is covered by a compressive stress film. A dummy region, the entire surface of which is covered by a combination of the tensile stress film and the compressive stress film, is disposed on the surface of the semiconductor substrate.

9 Claims, 16 Drawing Sheets

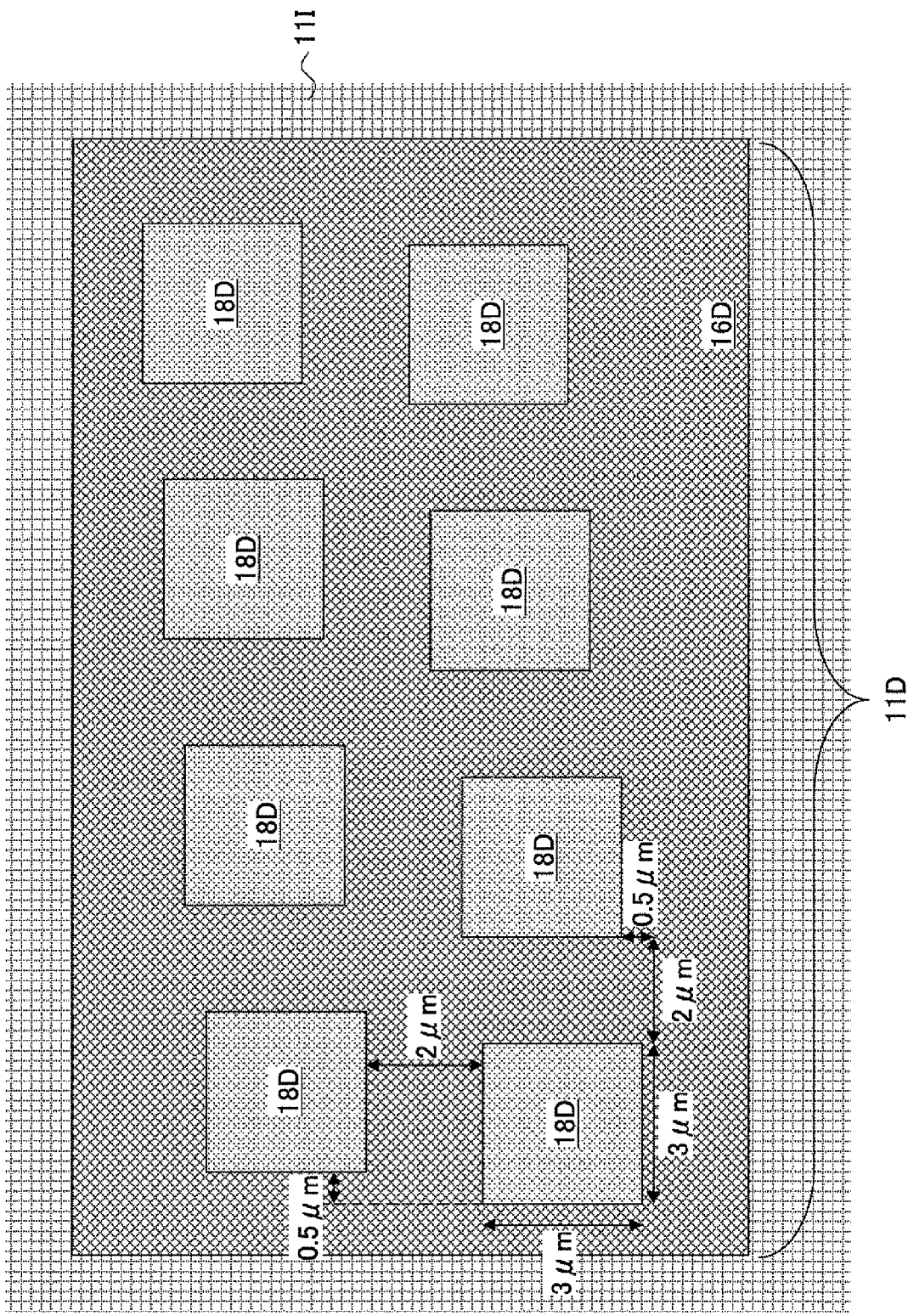

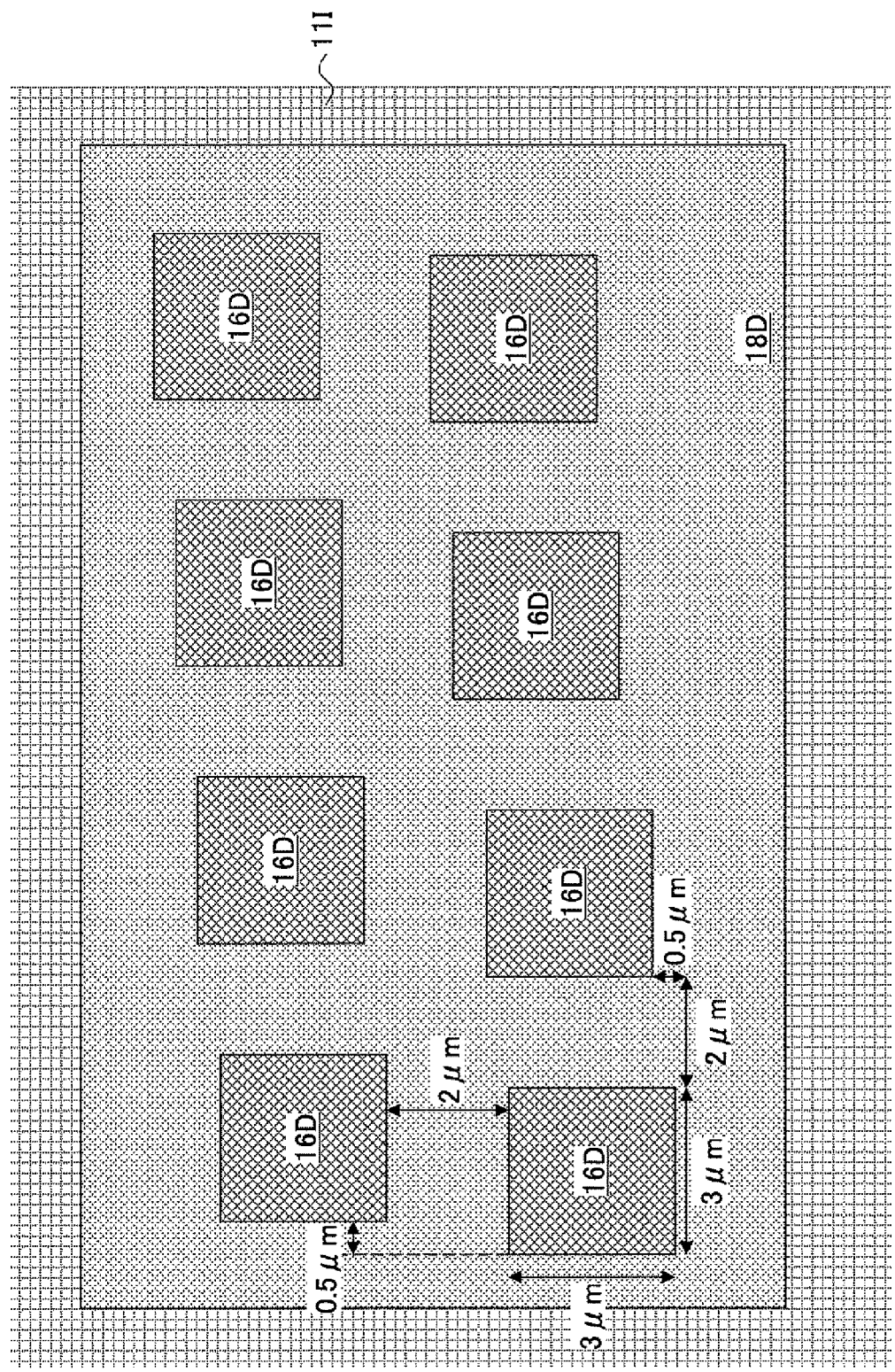

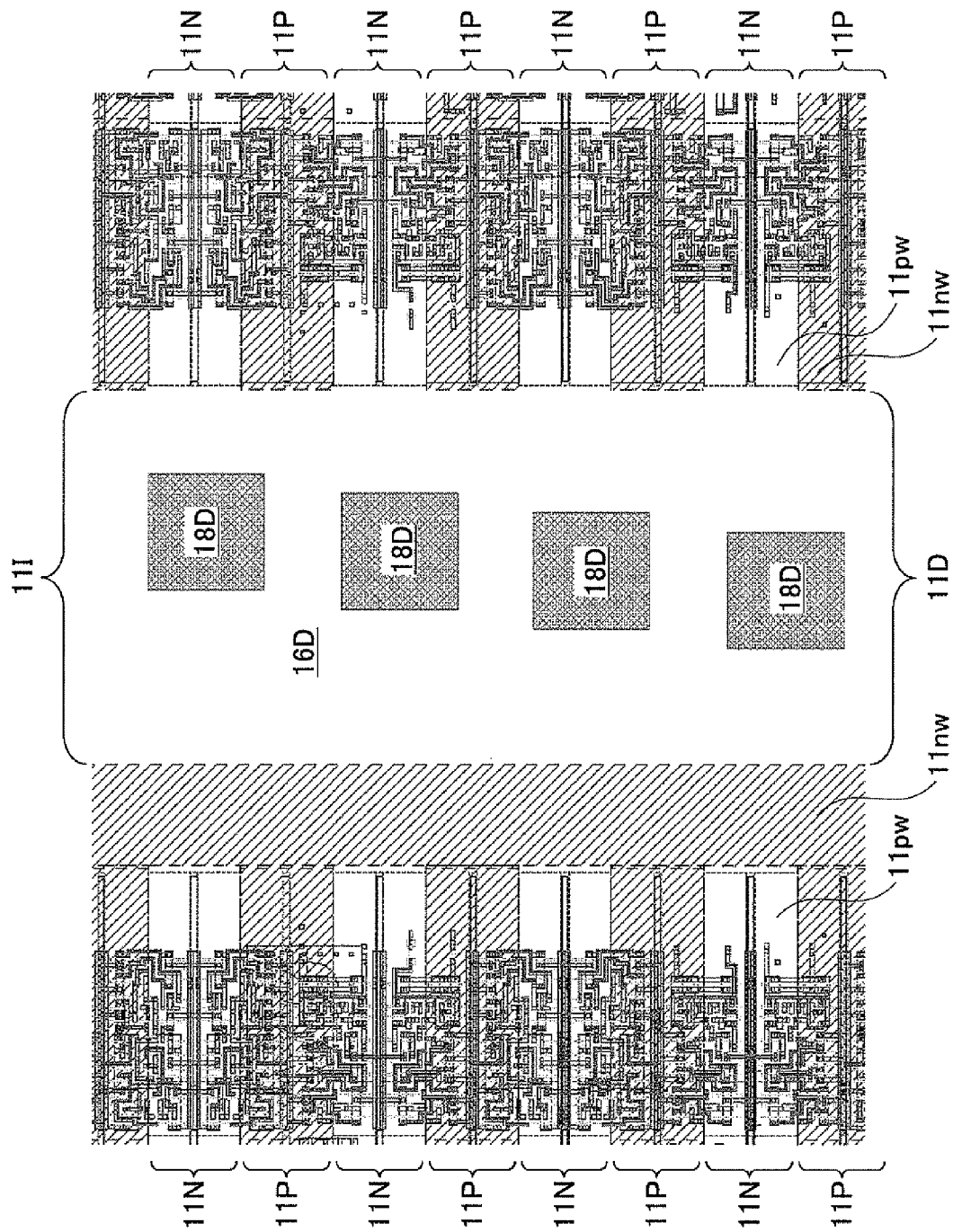

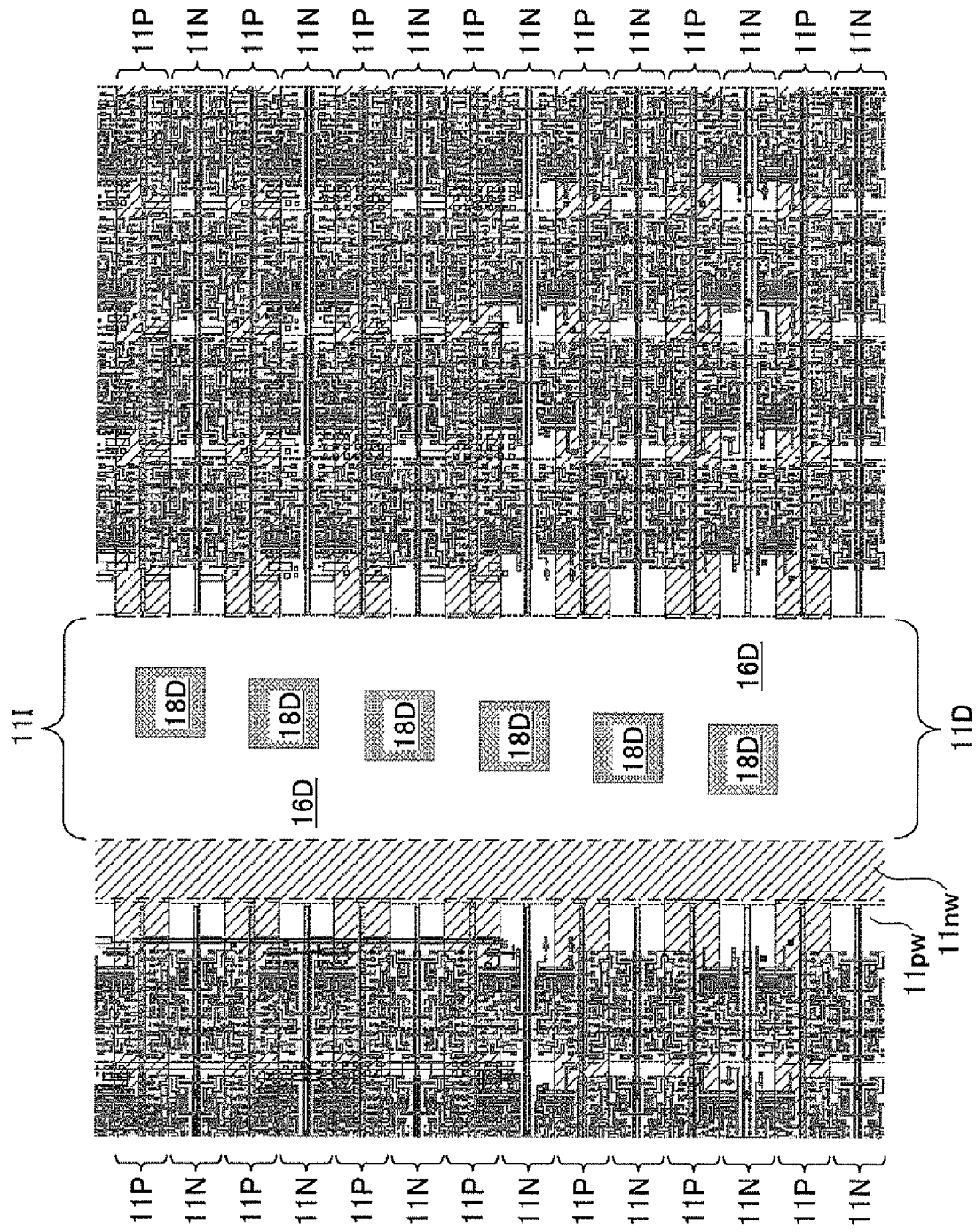

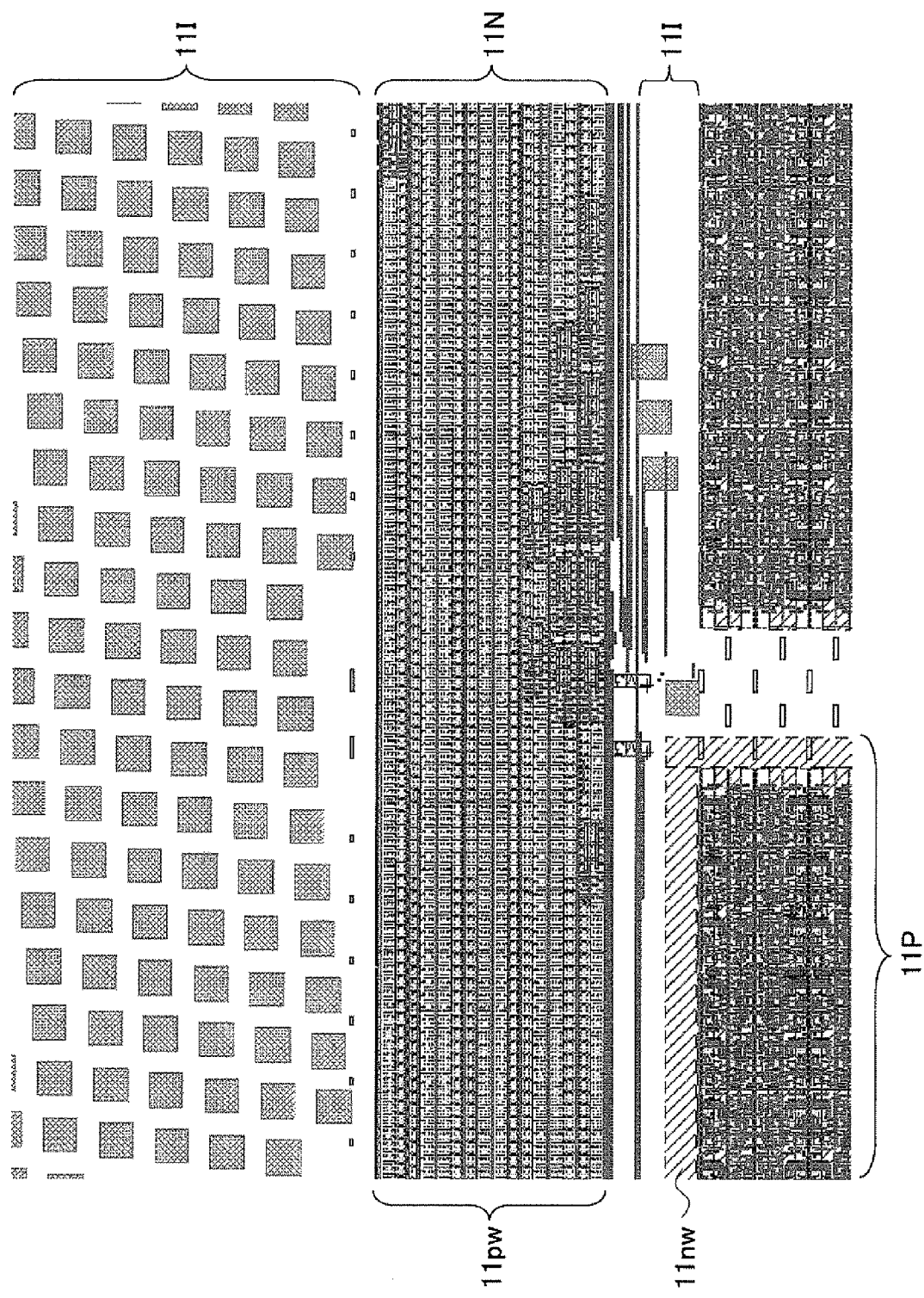

the compressive stress film is selectively removed from the region where the n-channel MOS transistor is formed.

Alternatively, the compressive stress film may be formed first, and the tensile stress film may be subsequently formed.

SEMICONDUCTOR INTEGRATED CIRCUIT DEVICE

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2007/057152, filed on Mar. 30, 2007, the entire contents of which are incorporated herein by reference.

FIELD

The present disclosure is broadly directed to a semiconductor device, and in particular to a semiconductor integrated circuit device including a p-channel MOS transistor and n-channel MOS transistor having improved operation speeds due to stress application.

BACKGROUND

Advancements in miniaturization technology have brought about nanoscale and ultrafast semiconductor devices having a gate length of 30 nm or less.

In such a nanoscale and ultrafast transistor, areas of channel regions just below gate electrodes are significantly small compared to those in a conventional semiconductor device. Accordingly, the mobility of electrons or holes through the channel regions is largely affected by stress applied to the channel regions. Given this factor, many approaches have been developed that optimize the stress applied to the channel regions, thereby improving the operation speed of semiconductor devices.

One of conventionally proposed structures is directed to the improvement of the operation speed of an n-channel MOS transistor, and involves forming a stress film (a typical example of such is an SiN film) having a tensile stress in such a manner as to include the gate electrode in the element region of the n-channel MOS transistor. In this way, the electron mobility in the channel region just below the gate electrode is improved.

Another conventionally proposed structure is directed to the improvement of the operation speed of a p-channel MOS transistor, and involves forming a stress film (such as an SiN film) having a compressive stress in such a manner as to include the gate electrode in the element region of the p-channel MOS transistor. In this way, the hole mobility in the channel region just below the gate electrode is improved.

Furthermore, a proposed semiconductor integrated circuit device has a structure in which a stress-application n-channel MOS transistor and a stress-application p-channel MOS transistor are integrated.

Such a semiconductor integrated circuit device is formed by the following procedures, for example.

That is, after an n-channel MOS transistor and a p-channel MOS transistor are formed on a semiconductor substrate, the entire structure is, first, covered by a tensile stress film. Patterning is then applied to the structure so as to selectively remove the tensile stress film from a region in which the p-channel MOS transistor is formed.

Subsequently, a compressive stress film is formed on the resultant structure in such a manner as to directly cover the p-channel MOS transistor in the region where the p-channel MOS transistor is formed, but cover the n-channel MOS transistor with the tensile stress film interposed in between in a region where the n-channel MOS transistor is formed. Next, the compressive stress film is selectively removed from the region where the n-channel MOS transistor is formed.

Alternatively, the compressive stress film may be formed first, and the tensile stress film may be subsequently formed.

Patterning of the compressive stress film is performed in the region where the n-channel MOS transistor is formed, and on the other hand, patterning of the tensile stress film is performed in the region where the p-channel MOS transistor is formed. It is therefore considered advantageous to use, for the patterning in each element region, an ion implantation mask used at the time of the well formation since this eliminates the necessity of designing a new mask pattern.

In view of this, a method of manufacturing a semiconductor integrated circuit device proposed by Japanese Laid-Open Patent Publication No. 2006-173432 involves the following procedures. That is, in the patterning of the tensile stress film, a mask used for the well formation in the element region of the p-channel MOS transistor is employed so as to leave a resist pattern only in the element region of the n-channel MOS transistor and remove the tensile stress film from the remaining region. On the other hand, in the patterning of the compressive stress film, a mask used for the well formation in the element region of the n-channel MOS transistor is employed so as to expose only the element region of the n-channel MOS transistor and, then, remove the tensile stress film only from the element region of the n-channel MOS transistor while covering the remaining region with a resist pattern.

In a semiconductor integrated circuit device formed in the above-mentioned manner, the tensile stress film is formed only in the element region of the n-channel MOS transistor and the remaining element region is covered by the compressive stress film. Alternatively, the compressive stress film is formed only in the element region of the p-channel MOS transistor and the remaining element region may be covered by the tensile stress film.

On the other hand, the area occupancies of the n-channel MOS transistor and the p-channel MOS transistor on the semiconductor substrate vary from product to product. Therefore, in such semiconductor integrated circuit devices, the area ratio between the tensile stress film and the compressive stress film is generally different from product to product.

Etching conditions for patterning are different between the tensile stress film and the compressive stress film. Accordingly, in the case where the area ratio between the tensile stress film and the compressive stress film on the semiconductor substrate is different among products, the etching conditions for patterning the tensile stress film and the compressive stress film need to be adjusted for individual products. However, it is difficult to optimize the etching conditions with respect to each product.

Recently, a business has been adopted that leases out different regions out of the same semiconductor wafer to various customers and manufactures semiconductor integrated circuit devices having different specifications according to individual requests for trial production. The above-described conventional manufacturing method cannot deal with cases like this.

SUMMARY

One aspect of the present disclosure is a semiconductor integrated circuit device including a semiconductor substrate; and multiple semiconductor elements disposed on the semiconductor substrate. The semiconductor elements include an n-channel MOS transistor and a p-channel MOS transistor. The n-channel MOS transistor is covered by a tensile stress film, and the p-channel MOS transistor is covered by a compressive stress film. A dummy region, the entire surface of which is covered by a combination of the tensile stress film and the compressive stress film, is disposed on the surface of the semiconductor substrate.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 illustrates an example of dummy stress film patterns according to the second embodiment of the present disclosure;

FIG. 5 illustrates an example of a dummy stress film pattern according to a modification of the second embodiment;

FIG. 6 illustrates an example of a semiconductor integrated circuit device having dummy stress film patterns;

FIG. 7 illustrates another example of the semiconductor integrated circuit device having dummy stress film patterns; and FIG. 8 illustrates yet another example of the semiconductor integrated circuit device having dummy stress film patterns.

DESCRIPTION OF EMBODIMENTS

First Embodiment

FIGS. 1A through 1I illustrate a method of manufacturing a semiconductor integrated circuit device according to the first embodiment of the present disclosure. On the semiconductor integrated circuit device, a stress-application p-channel MOS transistor and a stress-application n-channel MOS transistor are integrated.

Figure 1A:
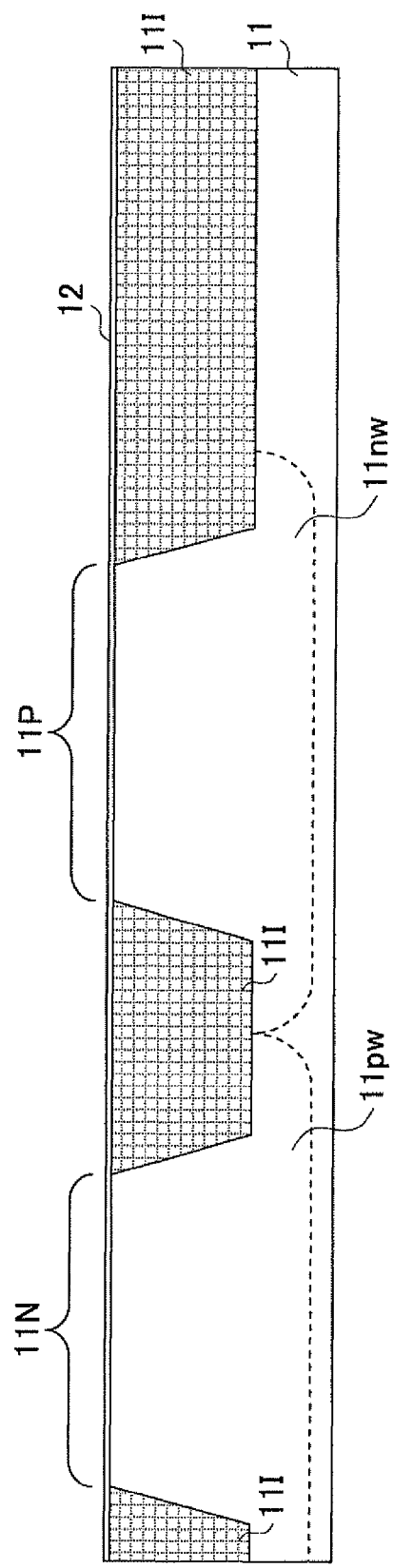
FIG. 1A illustrates a process (part 1) for manufacturing a semiconductor integrated circuit device according to the first embodiment of the present disclosure.

With reference to FIG. 1A, on a silicon substrate 11, an n-channel MOS transistor element region 11N and a p-channel MOS transistor element region 11P are defined by an element isolating region 11I having a shallow trench isolation (STI) structure. In the element region 11N, a p-type impurity element is introduced to form a p-type well 11pw, and in the element region 11P, an n-type impurity element is introduced to form an n-type well 11nw.

Furthermore, in the state illustrated in FIG. 1A, an insulating film 12, such as a thermally-oxidized film or an SiON film, is formed over the element regions 11N and 11P.

Figure 1B:
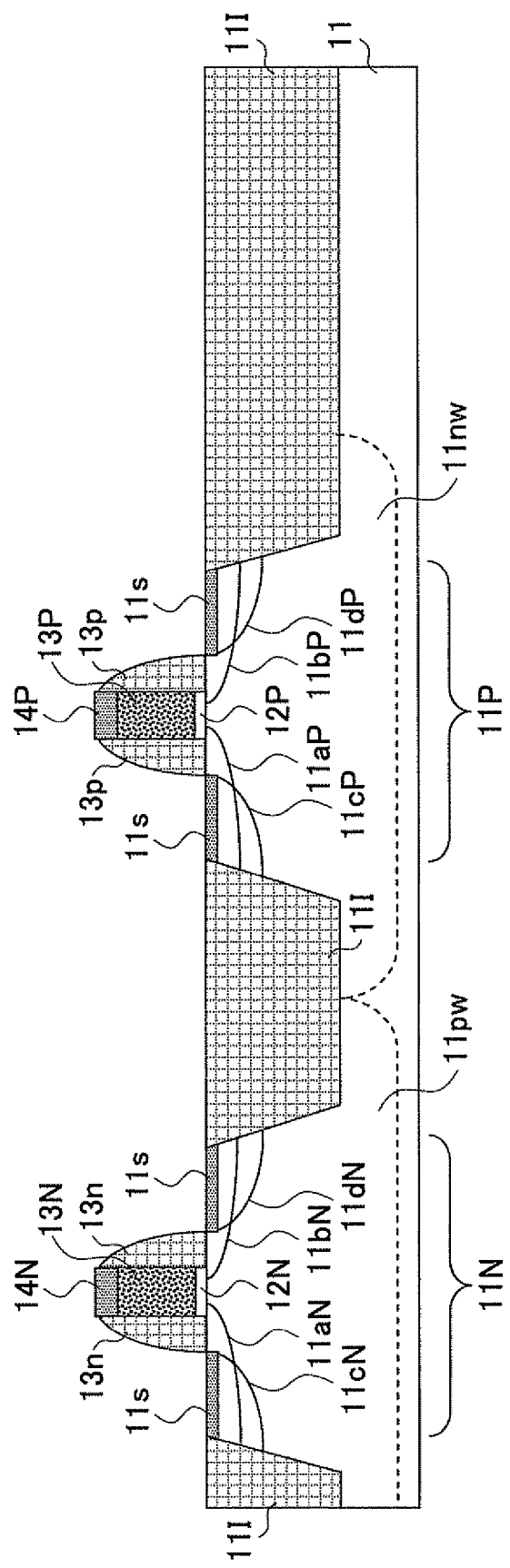
FIG. 1B illustrates a process (part 2) for manufacturing the semiconductor integrated circuit device according to the first embodiment of the present disclosure.

Next in the process illustrated in FIG. 1B, a gate electrode 13N and a gate electrode 13P made of polysilicon, metal or the like are formed in the element regions 11N and 11P, respectively, in such a manner that gate insulating films 12N and 12P formed of the insulating film 12 are disposed between the gate electrode 13N and the silicon substrate 11 and between the gate electrode 13P and the silicon substrate 11, respectively. In the element region 11N, an n-type source extension region 11aN and an n-type drain extension region 11bN are provided on a first side and a second side, respectively, of the gate electrode 13N.

Furthermore, sidewall insulating films 13n are formed on a first and a second sidewall surface which oppose each other across the gate electrode 13N. In the element region 11N, an n+ type source region 11cN and an n+ type drain region 11dN are disposed outward from the sidewall insulating films 13n. On the surface of the source region 11cN and the drain region 11dN, individual silicide layers 11s are formed.

In the case where the gate electrode 13N is formed using a polysilicon pattern, a silicide layer 14N is disposed also on the gate electrode 13N.

Also in the process illustrated in FIG. 1B, in the element region 11P, a p-type source extension region 11aP and a p-type drain extension region 11bP are provided on a first side and a second side, respectively, of the gate electrode 13P.

Furthermore, sidewall insulating films 13p are formed on a first and a second sidewall surface which oppose each other across the gate electrode 13P. In the element region 11P, a p+ type source region 11cP and a p+ type drain region 11dP are disposed outward from the sidewall insulating films 13p. On the surface of the source region 11cP and the drain region 11dP, individual silicide layers 11s are formed.

In the case where the gate electrode 13P is formed using a polysilicon pattern, a silicide layer 14P is disposed also on the gate electrode 13P.

Figure 1C:
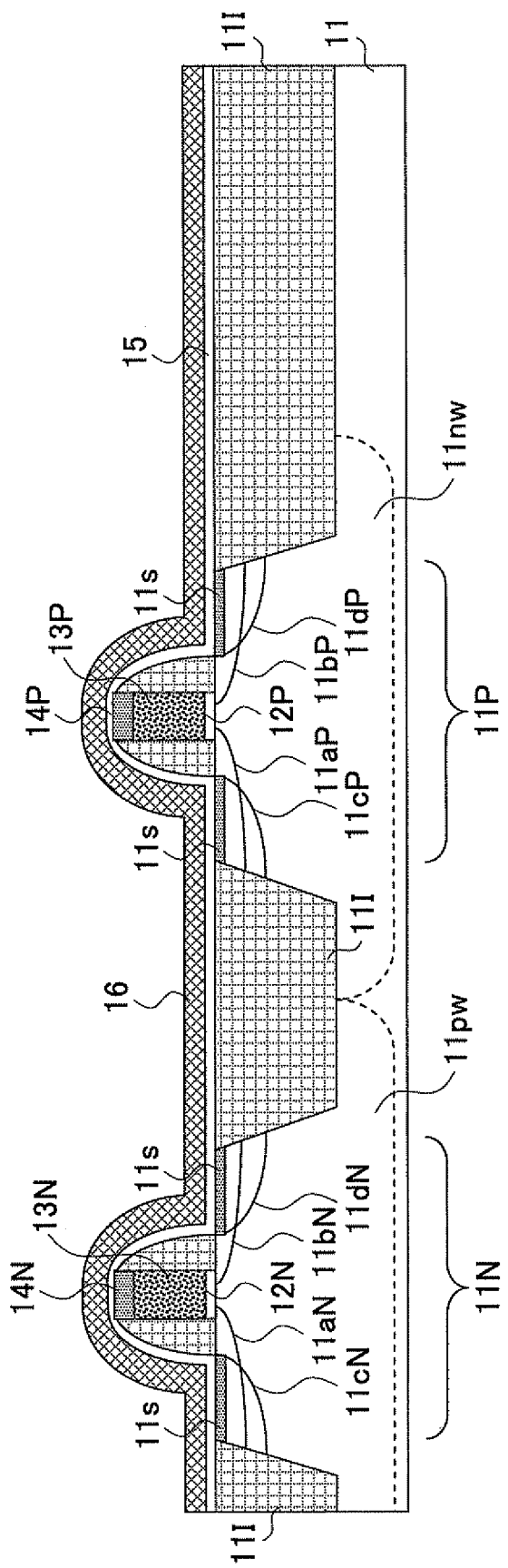
FIG. 1C illustrates a process (part 3) for manufacturing the semiconductor integrated circuit device according to the first embodiment of the present disclosure.

Next in the process illustrated in FIG. 1C, a silicon oxide film 15 is formed as an etching stopper film in a thickness of, for example, 10 nm over the structure of FIG. 1B by plasma CVD (chemical vapor deposition) which uses TEOS (tetraethyl orthosilicate) as a basic ingredient. On top of the silicon oxide film 15, an SiN film 16 having a tensile stress of, for example, 1.4 GPa is formed as a tensile stress film in a thickness of, for example, 80 nm. The formation of the SiN film 16 is achieved by thermal CVD using, for example, silane gas and ammonia gas as basic ingredients under the conditions of a pressure of between 0.1 and 400 Torr and a substrate temperature of between 500° C. and 700° C.

Figure 1D:
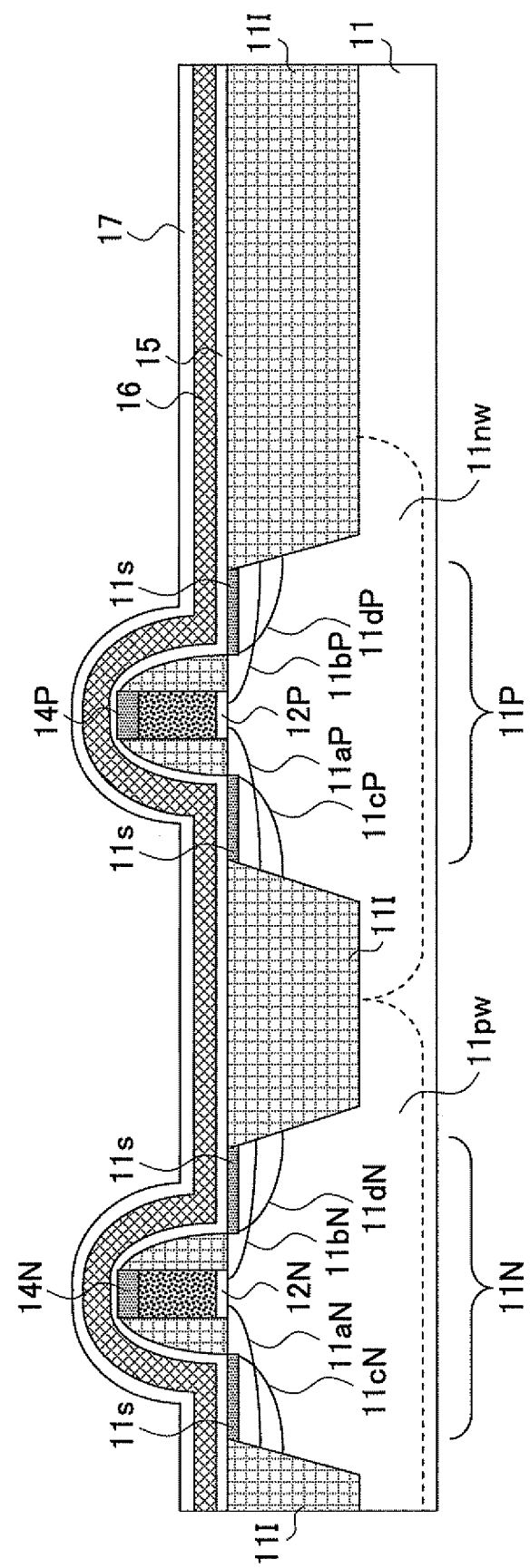
FIG. 1D illustrates a process (part 4) for manufacturing the semiconductor integrated circuit device according to the first embodiment of the present disclosure.
Figure 1E:
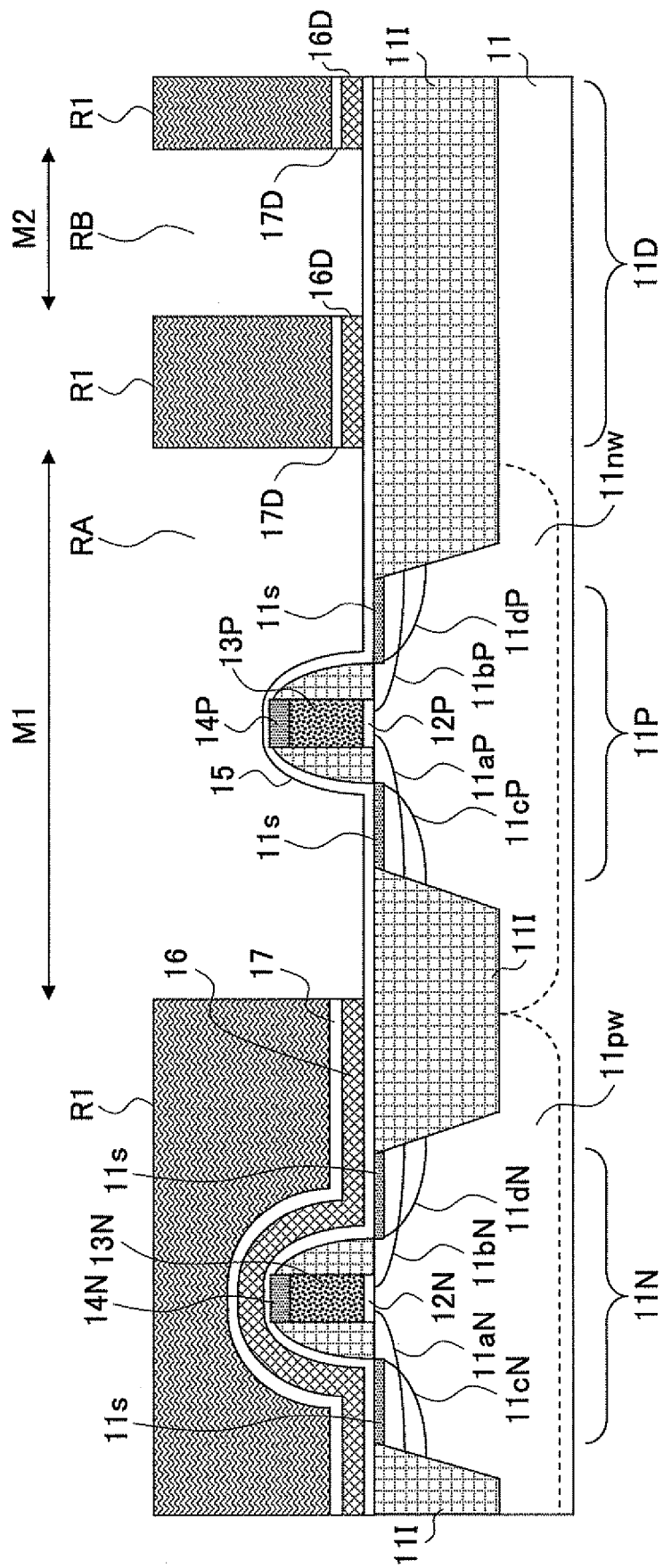
FIG. 1E illustrates a process (part 5) for manufacturing the semiconductor integrated circuit device according to the first embodiment of the present disclosure.

Next in the process illustrated in FIG. 1D, a silicon oxide film 17 is formed as an etching stopper film in a thickness of, for example, 20 nm over the structure of FIG. 1C by plasma CVD which uses TEOS as a basic ingredient, as in the case of the silicon oxide film 15. In the process of FIG. 1E, the silicon oxide film 17 and the SiN film 16 are selectively removed from the element region 11P using a resist pattern R1 covering the element region 11N as a mask and using the silicon oxide film 15 as an etching stopper.

At this point, in the present embodiment, a resist aperture RA is formed in the resist pattern R1 using exposure data M1 which are used to form the n-type well 11nw. With the resist aperture RA, the SiN film 16 is removed from the p-channel MOS transistor element region.

At the same time in the process of FIG. 1E, a dummy resist aperture RB is formed using dummy exposure data M2 over a part of the element isolating region 11I outside the element regions 11N and 11P. With the resist aperture RB, the silicon oxide film 17 and the underlying SiN film 16 are selectively removed using the silicon oxide film 15 as an etching stopper, at the same time when the procedure using the resist aperture RA is carried out. Herewith, an SiN dummy pattern 16D, on top of which a silicon oxide film pattern 17D is laid, is formed over the element isolating region 11I in a dummy region 11D.

The etching process of FIG. 1E is achieved by reactive ion etching (RIE) which uses $C_4F_8$ gas, argon gas and oxygen gas, for example.

Figure 1F:
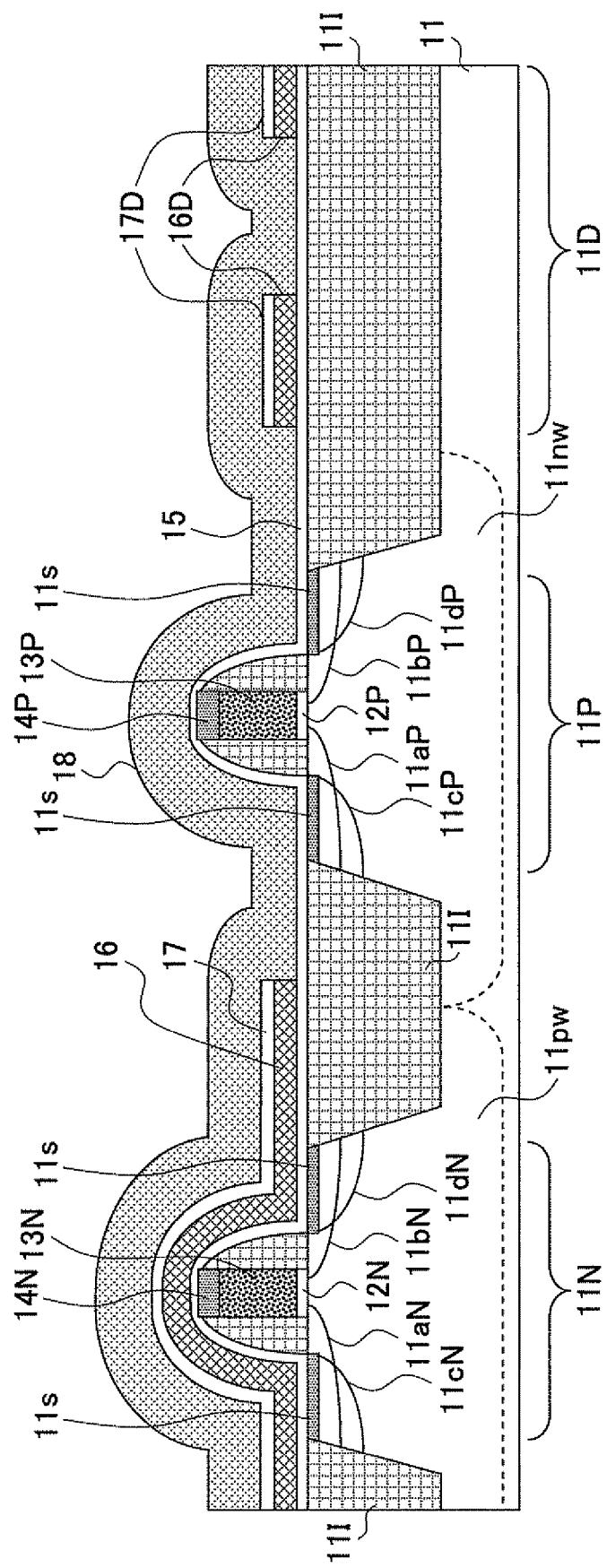
FIG. 1F illustrates a process (part 6) for manufacturing the semiconductor integrated circuit device according to the first embodiment of the present disclosure.

Next, in the process illustrated in FIG. 1F, the resist pattern R1 is removed, and then an SiN film 18 having a compressive stress of, for example, 1.4 GPa is formed over the structure of FIG. 1E as a compressive stress film in a thickness of, for example, 80 nm. The formation of the SiN film 18 is achieved by plasma CVD using, for example, silane gas and ammonia gas as basic ingredients under the conditions of a pressure of between 0.1 and 400 Torr and a substrate temperature of between 400° C. and 700° C.

Figure 1G:
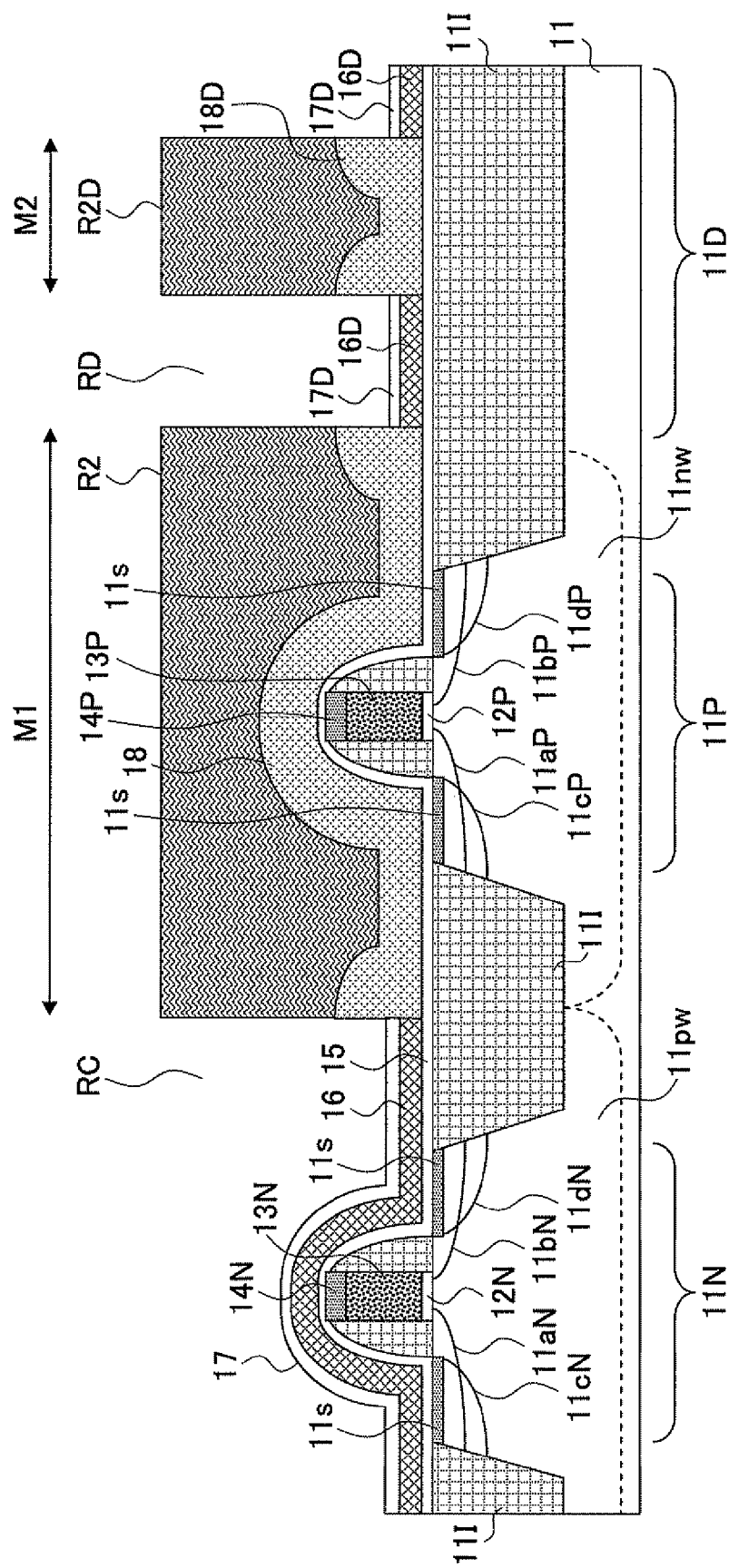
FIG. 1G illustrates a process (part 7) for manufacturing the semiconductor integrated circuit device according to the first embodiment of the present disclosure.

Next in the process illustrated in FIG. 1G, the silicon oxide film 18 is selectively removed from the element region 11N using a resist pattern R2 covering the element region 11P as a mask and using the silicon oxide film 17 as an etching stopper.

At this point, in the present embodiment, the resist pattern R2 is formed complementarily to the resist aperture RA using the exposure data M1 which are used to form the n-type well 11nw. As a result, the SiN film 18 is removed from an outside RC of the resist pattern R2, whereby the silicon oxide film 17 covering the n-channel MOS transistor is exposed.

The etching process of FIG. 1G is achieved by RIE using $CHF_3$ gas, Ar gas and oxygen gas.

At the same time in the process of FIG. 1G, a dummy resist pattern R2D is formed complementarily to the resist aperture RB using the dummy exposure data M2 over a part of the element isolating region 11I outside the element regions 11N and 11P. The SiN film 18 is selectively removed using the dummy resist pattern R2D as a mask and using the silicon oxide film 17 as an etching stopper, at the same time when the above-described procedure in the region RC is carried out. Herewith, an SiN dummy pattern 18D is formed in the dummy region 11D complementarily to the SiN dummy pattern 16D.

Figure 1H:
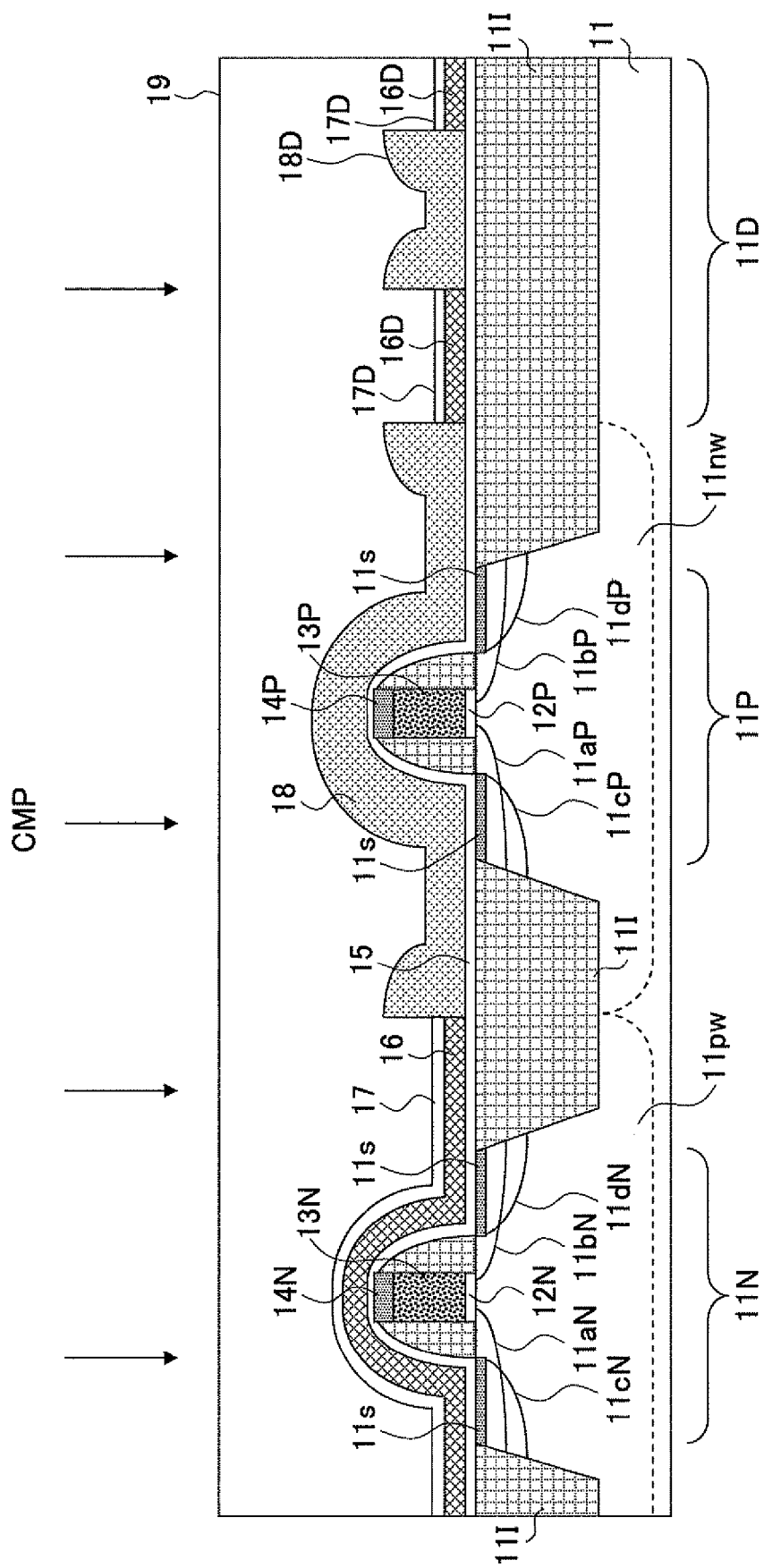
FIG. 1H illustrates a process (part 8) for manufacturing the semiconductor integrated circuit device according to the first embodiment of the present disclosure.
Figure 1I:
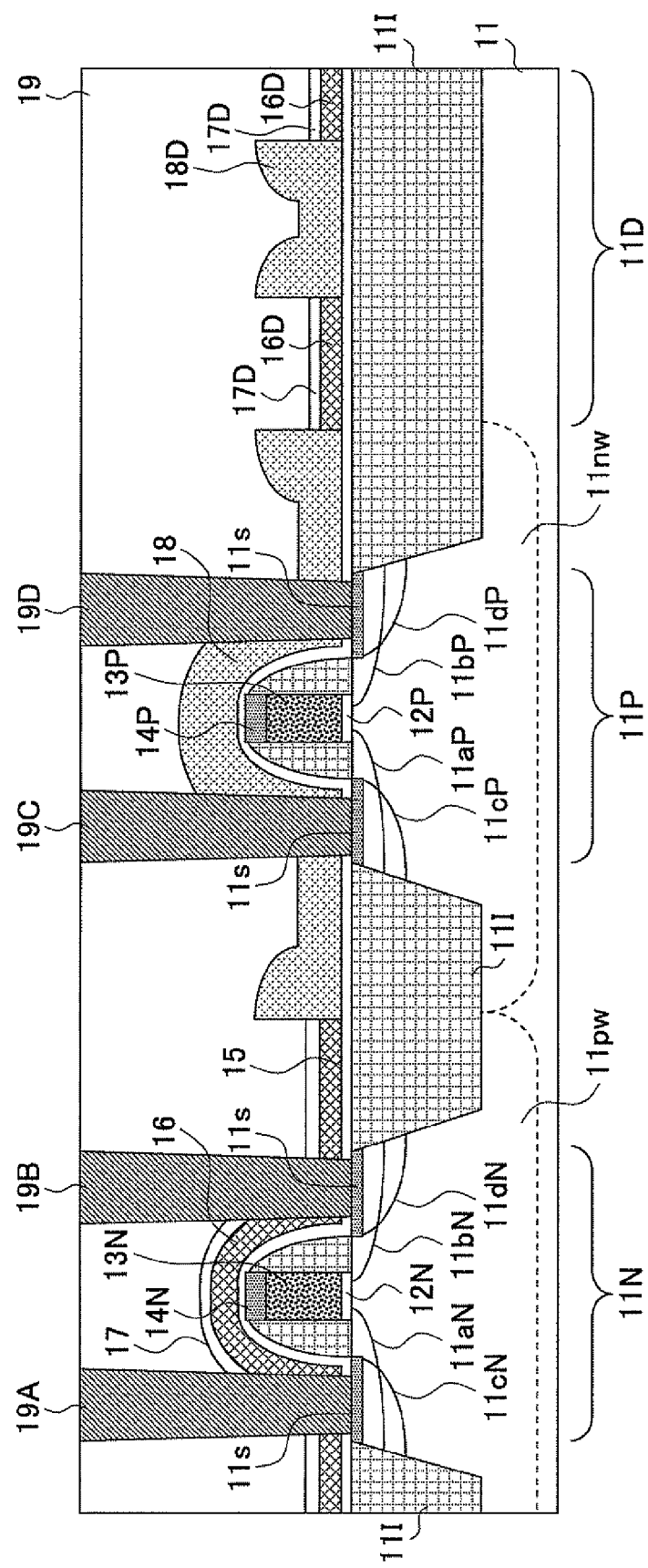
FIG. 1I illustrates a process (part 9) for manufacturing the semiconductor integrated circuit device according to the first embodiment of the present disclosure.

Next in the process illustrated in FIG. 1H, the resist patterns R2 and R2D are removed, and an interlayer insulating film 19 is disposed over the silicon substrate 11 so as to cover the exposed silicon oxide film 17 in the element region 11N, cover the exposed SiN film 18 in the element region 11P and cover the oxide film 17D covering the dummy pattern 16D as well as the dummy pattern 18D in the dummy region 11D. In the process illustrated in FIG. 1I after planarization is performed by chemical mechanical polishing (CMP), contact plugs 19A, 19B, 19C and 19D are formed in the interlayer insulating film 19 in such a manner as to be in contact with the diffusion regions 11cN, 11dN, 11cP and 11dP via the individual silicide layers 11s.

The present embodiment is able to simplify manufacturing processes of semiconductor integrated circuit devices in the case where different semiconductor integrated circuit devices are manufactured, for example, in the case of manufacturing, after a first device is manufactured, a second device with the element region 11N having a smaller total area. Specifically, when patterning is performed on the silicon oxide film 17 and the underlying tensile stress film 16 by RIE in the process of FIG. 1E, as described above, the total etching area of the SiN film 16 over the semiconductor substrate 11 is maintained constant by increasing the total area of the dummy pattern 16D. This eliminates the necessity of adjusting etching conditions with respect for each device, thus simplifying the manufacturing processes. Similarly, in the case of manufacturing, after a first device is manufactured, a second device with the element region 11N having a larger total area, the total etching area of the SiN film 16 over the semiconductor substrate 11 is maintained constant by reducing the total area of the dummy pattern 16D.

Figure 2:
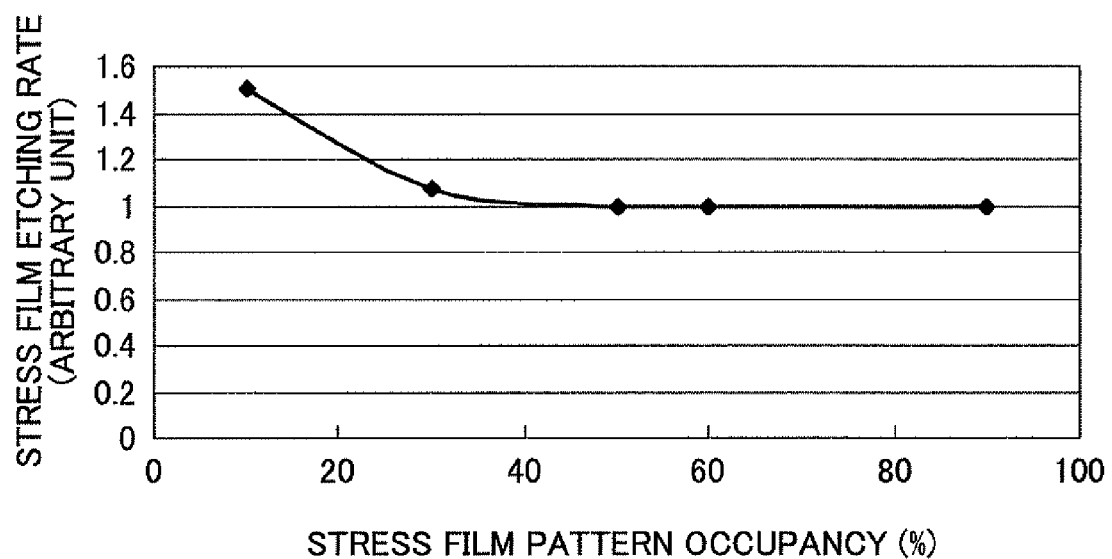
FIG. 2 illustrates the relationship between area occupancy of a stress film pattern and etching rate.

FIG. 2 illustrates the relationship between the etching rate and the area occupancy of the SiN film pattern formed on a silicon substrate and having compressive stress.

Etching is performed by RIE using $CHF_3$ gas, Ar gas and oxygen gas. With reference to FIG. 2, if the pattern occupancy over the silicon substrate is 30% or more, a substantially constant etching rate is achieved regardless of the pattern occupancy; however, if the pattern occupancy is less than 30%, the etching rate of the compressive stress film increases sharply.

It is considered that, in the case of a tensile stress film, substantially the same relationship exists between the etching rate and the pattern occupancy. Therefore, in a semiconductor device having a conventional structure in which the n-channel MOS transistor is covered by a tensile stress film and the p-channel MOS transistor is covered by a compressive stress film, if the total area of the n-channel MOS transistor accounts for 30% or less, for example, or if the total area of the p-channel MOS transistor accounts for 30% or less, the need arises to optimize the etching process of FIG. 1E or 1G.

On the other hand, in the present embodiment, the dummy patterns 16D and 18D are formed on the silicon substrate 11, whereby the ratio of the total area of the tensile stress film 16 to the total area of the compressive stress film 18 on the silicon substrate 11 is controlled to between 3/7 or more and 7/3 or less, preferably between 2/3 or more and 3/2 or less. Therefore, in either of the above cases (i.e. the case in which the total area of the n-channel MOS transistor accounts for 30% or less, and the case in which the total area of the p-channel MOS transistor accounts for 30% or less), the dry etching process of FIG. 1E can be performed under identical conditions, and similarly, the dry etching process of FIG. 1G can be performed under identical conditions.

In particular, by maintaining the ratio of the total area of the tensile stress film 16 to the total area of the compressive stress film 18 close to 1:1, it is possible to prevent the silicon substrate 11 or the silicon wafer from being distorted.

In the semiconductor integrated circuit device of the present embodiment, the tensile stress film 16 and the compressive stress film 18 are formed complementarily to each other. That is, the surface of the silicon substrate 11, except for the contact holes, is entirely covered by either one of the tensile stress film 16 and the compressive stress film 18 without substantial overlapping between the tensile stress film 16 and the compressive stress film 18. As a result, an extensive convex surface is absent on the silicon substrate 11, which facilitates planarization of the surface of the interlayer insulating film 19 by CMP during the formation of the interlayer insulating film 19. In the case where, due to displacement, the compressive stress film 18 locally overlaps the tensile stress film 16, or a gap is present at the junction area between the compressive stress film 18 and the tensile stress film 16, the present invention tolerates the overlapping part or the gap if it is comparable in width with a convex structure formed at where the compressive stress film 18 covers the gate electrode structure.

In the above embodiment, the following formation procedures may be adopted instead. That is, the compressive stress film 18 is first formed, and the tensile stress film 16 is formed after the compressive stress film 18 is selectively removed from the element region 11N.

Figure 3:
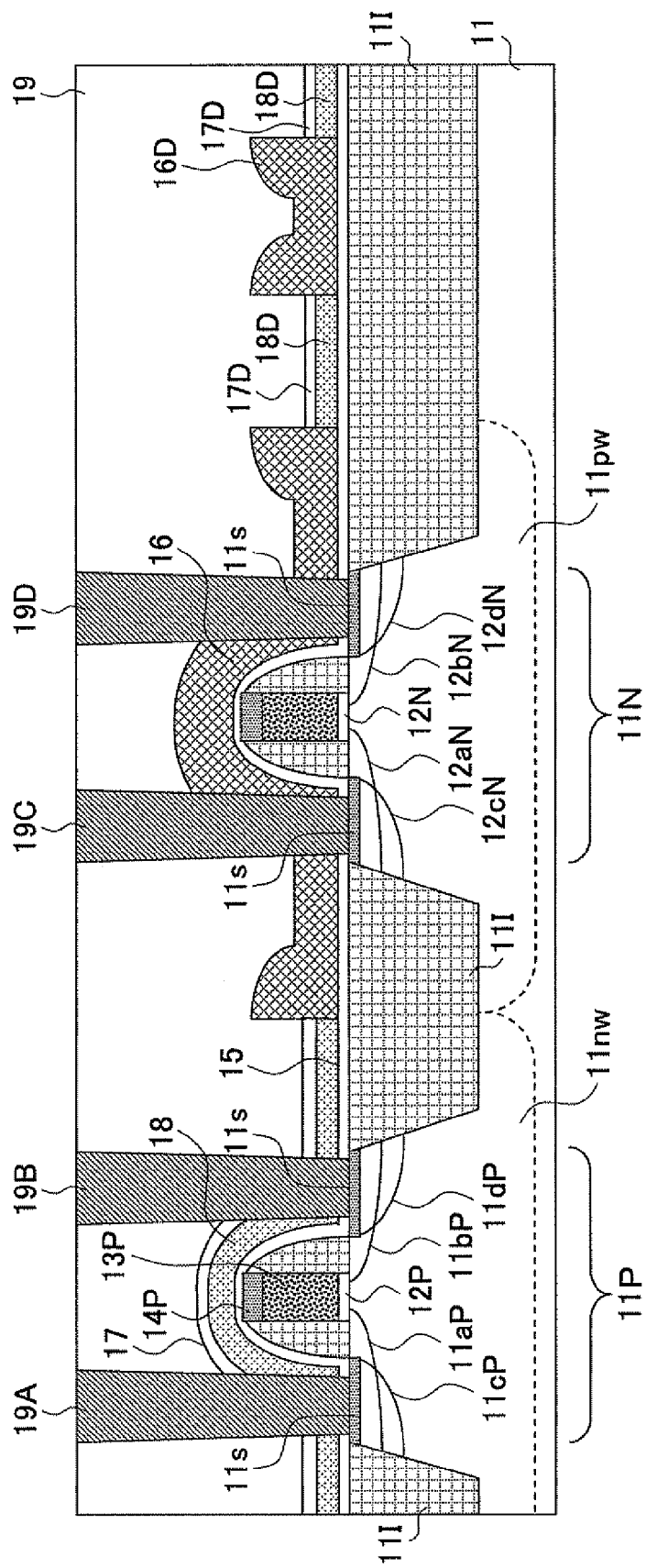
FIG. 3 illustrates a structure of a semiconductor integrated circuit device according to a modification of the first embodiment.

FIG. 3 illustrates the structure of such a semiconductor integrated circuit device in which the compressive stress film 18 is first formed and then the tensile stress film 16 is formed after the compressive stress film 18 is selectively removed from the element region 11N. In this case, the tensile stress film 16 laid on top of the compressive stress film 18 is selectively removed from the element region 11P. This structure should be clear from the descriptions given with reference to FIGS. 1A through 1I, and therefore, further explanation is omitted.

Second Embodiment

FIG. 4 illustrates an example of dummy patterns 16D and 18D formed in the dummy region 11D over the element isolating region 11I. Note that, in FIG. 4, the silicon oxide film 17D disposed on the surface of the dummy pattern 16D is not illustrated.

With reference to FIG. 4, according to the present embodiment, the dummy patterns 18D, each of which is formed of a compressive stress film measuring 3 μm per side, are disposed at intervals of 2 μm with a shift of 0.5 μm from the nearest dummy patterns 18D in orthogonal directions.

The area ratio of the compressive stress film and the tensile stress film can be finely adjusted if the size of each dummy pattern 18D is reduced; however, if the size of the dummy pattern 18D is too small, drawing data becomes large, which incurs in an increase in manufacturing cost of the semiconductor integrated circuit device. Accordingly, it is preferable to form each dummy pattern 18D measuring about 1 to 5 μm per side. The interval of the dummy patterns 18D is adjusted according to the area ratio between the compressive stress film and the tensile stress film.

In FIG. 4, it appears that the element isolating region 11I outside the dummy pattern 16D is exposed; however, the figure is illustrated in this manner only for the intension of indicating that the dummy pattern 16D is formed over the element isolating region 11I, and the surface of the element isolating region 11I is not exposed in fact.

According to FIG. 4, the isolated dummy patterns 18D having compressive stress are aligned in the dummy pattern 16D having tensile stress. However, isolated dummy patterns 16D having tensile stress may be aligned in a dummy pattern 18D having compressive stress, as illustrated in FIG. 5.

FIGS. 6 through 8 illustrate examples of dummy patterns formed in various semiconductor integrated circuit devices.

According to the examples of FIGS. 6 and 7, the strip-shaped element regions 11P, each including the n-type well 11nw, and the strip-shaped element regions 11N, each including the p-type well 11pw, are alternately aligned, and the isolated dummy patterns 18D are formed, over the element isolating region 11I, complementarily to the dummy pattern 16D.

On the other hand, according to the example of FIG. 8, the element region 11P including the n-type well 11nw and the element region 11N including the p-type well 11pw are separately formed on the silicon substrate. In this case also, it can be seen that the dummy patterns 18D are formed, over the element isolating region 11I, complementarily to the dummy pattern 16D.

According to the examples of FIGS. 6 through 8, the isolated dummy patterns 18D are formed complementarily to the continuous dummy pattern 16D which is formed of a tensile stress film. However, alternatively, the isolated dummy patterns 16D may be formed complementarily to the continuous dummy pattern 18D which is formed of a compressive stress film.

The following Table 1 concerns various semiconductor integrated circuit devices, Products A through D, and various test element groups TEG1 through TEG4, and illustrates examples of the area occupancy of the compressive stress film before and after insertion of the dummy patterns 18D.

TABLE 1

| | AREA OCCUPANCY OF COMPRESSIVE STRESS FILM | |
| --- | --- | --- |
| | BEFORE DUMMY INSERTION | AFTER DUMMY INSERTION |
| PRODUCT A | 29.73% | 42.27% |
| PRODUCT B | 26.00% | 40.62% |
| PRODUCT C | 20.53% | 39.78% |
| PRODUCT D | 23.92% | 38.55% |
| TEG1 | 10.73% | 36.17% |
| TEG2 | 11.61% | 37.90% |
| TEG3 | 17.07% | 41.06% |
| TEG4 | 15.01% | 36.82% |

With reference to Table 1, as for Products A through D, the area occupancy of the compressive stress film before the insertion of the dummy patterns 18D is between 20% and 30%; however, the area occupancy after the insertion of the dummy patterns 18D increases to between 38% and 42%.

Also, as for TEG1 through TEG4, while the area occupancy of the compressive stress film before the insertion of the dummy patterns 18D is between 10% and 15%, the area occupancy after the insertion of the dummy patterns 18D increases to between 36% and 41%.

In conclusion, the present disclosure relates to a semiconductor integrated circuit device having a structure in which a tensile stress film is provided over the n-channel MOS transistor and a compressive stress film is provided over the p-channel MOS transistor. On a part of the semiconductor substrate at which neither the n-channel MOS transistor nor the p-channel MOS transistor are formed, the dummy pattern of the tensile stress film and the dummy pattern of the compressive stress film are formed complementarily to each other. That is, the surface of the semiconductor substrate is substantially covered by either one of the tensile stress film and the compressive stress film. Accordingly, in the case of manufacturing various semiconductor integrated circuit devices having different specifications of the p-channel MOS transistor and the n-channel MOS transistor, it is not necessary to optimize the etching processes conducted when patterning is performed on the tensile stress film and the compressive stress film, thereby reducing the manufacturing costs of the semiconductor integrated circuit devices. In addition, the ratio between the total area of the tensile stress film and the total area of the compressive stress film is controlled close to 1 by forming the dummy patterns, thereby preventing the semiconductor substrate from being distorted.

Thus, the embodiments of the present disclosure have been described in detail; however, it should be understood that the present invention is not limited to the particular embodiments and various changes and modification may be made to the particular embodiments without departing from the scope of the broad scope of the present invention as defined in the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A semiconductor integrated circuit device comprising:
   a semiconductor substrate which includes an element region and a dummy region;
   an n-channel MOS transistor and a p-channel MOS transistor formed in the element region;
   a tensile stress film formed on the semiconductor substrate and the n-channel MOS transistor; and
   a compressive stress film formed on the semiconductor substrate and the p-channel MOS transistor,
   wherein the dummy region is covered by a combination of the tensile stress film and the compressive stress film,
   wherein the tensile stress film includes a first dummy pattern in the dummy region,
   wherein the compressive stress film includes a second dummy pattern in the dummy region,
   wherein one of the first dummy pattern and the second dummy pattern is surrounded by the other of the first dummy pattern and the second dummy pattern and isolated in the dummy region, and
   wherein in the dummy region, a ratio between a total area of the tensile stress film and a total area of the compressive stress film over a surface of the semiconductor substrate is in a range of 3/7 to 7/3.

2. The semiconductor integrated circuit device as claimed in claim 1, wherein the dummy region includes a tensile stress film region or a compressive stress film region and is isolated from active regions of the n-channel MOS transistor and the p-channel MOS transistor.

3. The semiconductor integrated circuit device as claimed in claim 1, wherein in the dummy region, the ratio between the total area of the tensile stress film and the total area of the compressive stress film over the surface of the semiconductor substrate is in a range of 2/3 to 3/2.

4. The semiconductor integrated circuit device as claimed in claim 1, wherein the dummy region is disposed in an element isolating region provided on the semiconductor substrate.

5. The semiconductor integrated circuit device as claimed in claim 1, wherein the dummy patterns are identical to each other and aligned in an element isolating region at regular intervals.

6. The semiconductor integrated circuit device as claimed in claim 5, wherein each of the dummy patterns has a shape of a square with 1 nm to 5 nm per side.

7. The semiconductor integrated circuit device as claimed in claim 1, further comprising:
   an element isolation region formed in the semiconductor substrate,
   wherein the first dummy pattern is formed on the element isolation region.

8. The semiconductor integrated circuit device as claimed in claim 1, wherein a plurality of first dummy patterns are formed in the dummy region, and each of the first dummy patterns is surrounded by the second dummy pattern.

9. The semiconductor integrated circuit device as claimed in claim 8, wherein the plurality of first dummy patterns are formed by a repetition of a single dummy pattern arranged at first intervals in the dummy region.

* * * * *